Jan. 3, 1967 F. C. PARRY 3,296,362

DEVICE FOR INTERCONNECTING TERMINALS ON A BACK-PANEL

Filed Dec. 23, 1963

INVENTOR.
FORREST C. PARRY

BY Elmer Galbiati

ATTORNEY

United States Patent Office
3,296,362
Patented Jan. 3, 1967

3,296,362

DEVICE FOR INTERCONNECTING TERMINALS ON A BACK-PANEL

Forrest C. Parry, Katonah, N.Y., assignor to International Business Machines Corporation, New York, N.Y., a corporation of New York Filed Dec. 23, 1963, Ser. No. 332,671
1 Claim. (Cl. 174—88)

This invention relates to the fabrication of electrical circuitry and, more particularly, to the installation of wires between terminals.

The components in complex electronic circuitry such as digital computers are generally mounted in modules or on printed circuit cards. These modules or printed circuit cards are in turn mounted on one side of a back-panel. The back-panel has a plurality of terminals on the second side thereof. Wires from the modules or printed circuit cards are attached through the back-panel to the terminals, and then the various modules or printed circuit cards are interconnected by means of wires which interconnect the various terminals.

Back-panels sometimes include a very large number of terminals and a large number of connections between the terminals. Due to the large number of terminals, it is generally difficult to accurately insure that the correct terminals are being interconnected. Furthermore, manually locating particular terminals which are to be interconnected is a very time consuming operation. Machines have been designed to automatically wire back-panels; however, these machines are expensive and they are not suited for many relatively small wiring operations such as installing wiring changes after a machine has been shipped to a customer's location.

Co-pending application Serial Number 332,673, entitled "Wire Installation" by Charles H. Propster, filed December 23, 1963, which is assigned to the assignee of the present invention, teaches a method for wiring back-panels which consist of making a mat with wires embedded therein. The mat has holes corresponding to the terminals on the back-panel and the ends of each wire protrude through the holes which correspond to the terminals to which the particular wire is to be connected. The mat is placed over the terminals on the back-panel, thereby positioning the ends of each wire adjacent to the pins to which the ends are to be connected. The ends of each wire can then be easily connected to the appropriate terminals by conventional techniques.

The method described in the above-referenced application has the disadvantage that the mat with the wires embedded therein is expensive and difficult to make on a production line basis. The present invention provides an improved device for holding the wires in the correct position for subsequent connection to the terminals on a back-panel.

An object of the present invention is to provide an improved means for interconnecting terminals on a back-panel.

A further object of the present invention is to reduce the amount of time required to selectively interconnect terminals on a back-panel.

Yet another object of the present invention is to minimize the possibility of errors during the interconnection of terminals on a back-panel.

Yet another object of the present invention is to simplify the operation of wiring back-panels.

Another object of the present invention is to provide an inexpensive means for holding wires for subsequent positioning on a back-panel.

Yet another object of the present invention is to provide a device in accordance with the above objects which can be easily fabricated by mass production techniques.

The present invention provides a supporting member which has one hole corresponding to each terminal. The supporting member has a layer of adhesive material on one side thereof and the wires which are to interconnect terminals are attached to the supporting member by means of the adhesive material. The ends of each wire protrude through the holes which correspond to the terminals which are to be interconnected by the particular wire. The supporting member with the attached wires is placed over the terminals on the back-panel, each terminal protruding through its associated hole. The ends of the wires which protrude through the holes can be easily connected to the appropriate terminals.

The foregoing and other objects, features and advantages of the invention will be apparent from the following more particular description of a preferred embodiment of the invention, as illustrated in the accompanying drawings.

Figure 1:
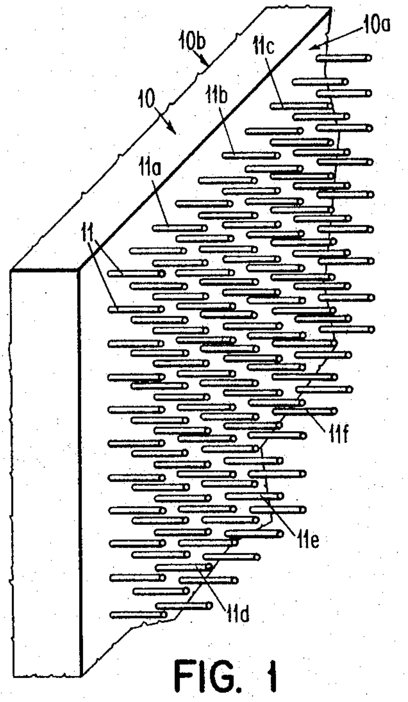
FIGURE 1 shows a portion of a back-panel.

FIGURE 1 shows a back-panel 10 which has a front side 10*a* and a back side 10*b*. A plurality of terminals 11 are mounted on side 10*a*, and electrical components (not shown) are mounted on side 10*b*. The components located on side 10*b* may be printed circuit cards or other types of circuit modules. Terminals 11 extend through panel 10, and they are selectively connected to the various components on side 10*b* of the panel. The various components located on side 10*b* can be interconnected by placing wires between selected ones of terminals 11 on side 10*a*. In the specific embodiment shown herein, the three sets of terminals designated (A), (B), and (C) below will be interconnected.

(A) Terminal 11*a* will be connected to terminal 11*d*;

(B) Terminal 11*b* will be connected to terminal 11*e*; and (C) Terminal 11*c* will be connected to terminal 11*f*.

Figure 2:
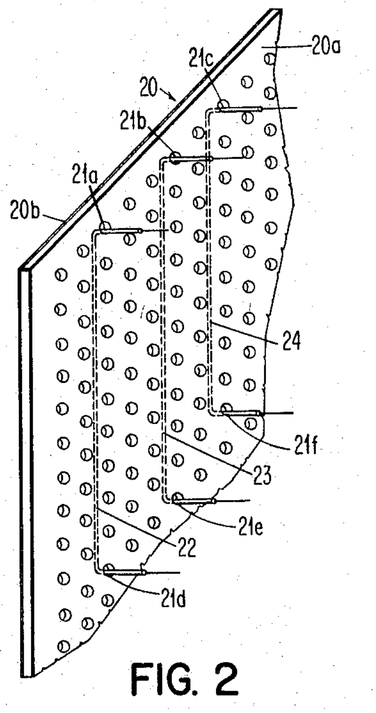
FIGURE 2 shows a mat with wires attached.

FIGURE 2 shows the wiring mat 20 which is used to position the wires between the selected terminals. Wiring mat 20 has a plurality of holes 21. The location of holes 21 correspond to the location of terminals 11 so that wiring mat 20 can be placed on back-panel 10 with terminals 11 protruding through holes 21. For ease of reference, the holes in wiring mat 20 which correspond to terminals 11*a* to 11*f* are respectively designated 21*a* to 21*f*.

Wiring mat 20 has three wires designated 22, 23 and 24 attached thereto. Wires 22 to 24 are attached to side 20*b* of wiring mat 20, and their end portions extend through holes 21 in the mat. The three wires 22, 23 and 24 correspond to the three connections (A), (B), and (C) specified above.

Figure 3:
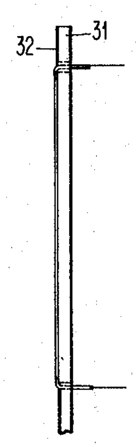
FIGURE 3 shows a side view of the mat shown in FIGURE 2.

FIGURE 3 shows a cross sectional view of wiring mat 20. The wiring mat 20 includes a supporting member 31 and a layer of pressure-sensitive adhesive material 32. The mat is fabricated by first spreading adhesive material 32 over supporting member 31 and inserting the wires 22, 23 and 24 in the appropriate holes, thereby binding the wires to the mat.

Figure 4:
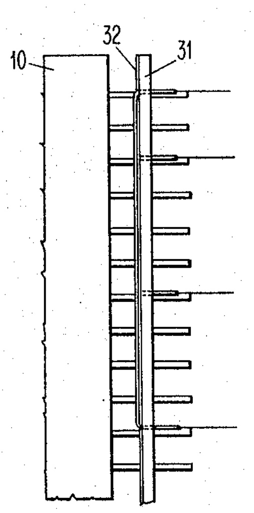
FIGURE 4 shows the mat inserted over the terminals on a back-panel.

In order to make the connections designated as (A), (B) and (C) above, the mat is placed over terminals 11 as shown in FIGURE 4, each end piece of each wire is thereby juxtaposed to the specific terminal element which must be connected to the particular end piece. Each wire can now be attached to its appropriate terminal by "wire wrapping" or other conventional techniques. Terminal

Figure 5:
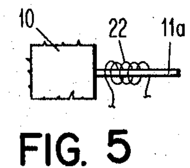
FIGURE 5 shows a wire connected to a terminal by wire wrapping techniques.

11*a* with wire 22 attached thereto by conventional wire wrapping technique is shown in FIGURE 5.

When the device of the present invention is produced on a production basis, the starting point can be a sheet of paper which has a layer of gummy material on one side thereof. The paper can be purchased with the gummy or sticky material already applied and protected by a cover sheet of paper. For example, such paper is commercially available from the Presto Adhesive Paper Company of Glendale, California, as Bristol 13-point white paper with V-200 adhesive backing (trade-mark). In order to prepare the mat: (1) appropriate holes are punched in the paper; (2) the sheet of protective paper is removed from the adhesive material; and (3) the wires are inserted in the correct holes, the adhesive material being used to bond the wires to the mat. After the wires are attached to the mat the sheet of covering paper may be replaced over the adhesive material for convenience in shipping.

Wires can be inserted in the appropriate holes in the mat manually without a template or manually using a template which has slots therein through which the wires are inserted to insure correct positioning, or the wires can be inserted automatically by programmed machines which are similar to the automatic machines presently used to wire back-panels.

It is noted that the term back-panel as used herein merely refers to a member for supporting a plurality of terminals.

Selected wires can be removed from a back-panel by placing a template over the back-panel which shows the particular wires which should be removed.

While the invention has been particularly shown and described with reference to a preferred embodiment thereof, it will be understood by those skilled in the art that the foregoing and other changes in the form and details may be made therein without departing from the spirit and scope of the invention.

What is claimed is:

In combination:

a back-panel having a plurality of terminals, preselected pairs of which are to be electrically interconnected;

a plurality of wires interconnecting preselected pairs of said terminals;

means simultaneously positioning each end of said plurality of wires in connectable relationship to its respective preselected terminal, said means comprising a flat, sheet-like, flexible member having a plurality of holes corresponding in number and position to said terminals on said back-panel, and positioned on said back-panel with the free ends of said terminals extending through said holes, an adhesive material on the surface of said member adjacent said back-panel operable maintaining said wires in position relative to said member;

each of said wires being attached to said member by said adhesive material and pre-positioned thereon with its ends protruding through holes corresponding to the preselected pair of terminals which are interconnected by that wire.

References Cited by the Examiner

UNITED STATES PATENTS 2,066,876 5/1937 Carpenter et al.

References Cited by the Applicant

UNITED STATES PATENTS 2,066,876 1/1937 Carpenter.
2,959,848 11/1960 Savitt.
3,019,489 2/1962 Burg.
3,103,061 9/1963 Fonoroff.

LEWIS H. MYERS, *Primary Examiner.*

DARRELL L. CLAY, *Assistant Examiner.*